(12) United States Patent
Sane et al.

(10) Patent No.: US 7,781,260 B2
(45) Date of Patent: Aug. 24, 2010

(54) METHODS OF FORMING NANO-COATINGS FOR IMPROVED ADHESION BETWEEN FIRST LEVEL INTERCONNECTS AND EPOXY UNDER-FILLS IN MICROELECTRONIC PACKAGES AND STRUCTURES FORMED THEREBY

(75) Inventors: Sandeep Sane, Chandler, AZ (US); Nachiket Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 423 days.

(21) Appl. No.: 11/853,752

(22) Filed: Sep. 11, 2007

(65) Prior Publication Data

US 2009/0065932 A1    Mar. 12, 2009

(51) Int. Cl.
*H01L 21/44* (2006.01)
*H01L 21/48* (2006.01)

(52) U.S. Cl. ............... 438/108; 438/127; 257/E21.503
(58) Field of Classification Search .................. None
See application file for complete search history.

(56) References Cited

U.S. PATENT DOCUMENTS

| 7,331,106 | B2 * | 2/2008 | Workman et al. ............. 29/840 |
| 7,615,476 | B2 * | 11/2009 | Hua ........................... 438/612 |
| 7,645,512 | B1 * | 1/2010 | Sammakia et al. .......... 428/403 |
| 2003/0218258 | A1 * | 11/2003 | Charles et al. .............. 257/783 |

* cited by examiner

*Primary Examiner*—Scott B Geyer
(74) *Attorney, Agent, or Firm*—Kathy J. Ortiz

(57) ABSTRACT

Methods and associated structures of forming microelectronic devices are described. Those methods may include coating an interconnect structure disposed on a die with a layer of functionalized nanoparticles, wherein the functionalized nanoparticles are dispersed in a solvent, heating the layer of functionalized nanoparticles to drive off a portion of the solvent, and applying an underfill on the coated interconnect structure.

14 Claims, 9 Drawing Sheets

US 7,781,260 B2

METHODS OF FORMING NANO-COATINGS FOR IMPROVED ADHESION BETWEEN FIRST LEVEL INTERCONNECTS AND EPOXY UNDER-FILLS IN MICROELECTRONIC PACKAGES AND STRUCTURES FORMED THEREBY

BACKGROUND OF THE INVENTION

Poor adhesion between epoxy-based under-fill materials and copper interconnects may be of concern when used in lead-free packages. Poor adhesion may result in failures during post assembly processes and/or during reliability testing. In some cases, wicking of lead free solders (such as SnAg or SnAgCu, for example) may not occur along an entire surface of an interconnect structure, such as a copper bump for example. This may result in a greater amount of the interconnect structure being exposed, which may then lead to poor adhesion with under-fill materials that may be dispensed during subsequent processing.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
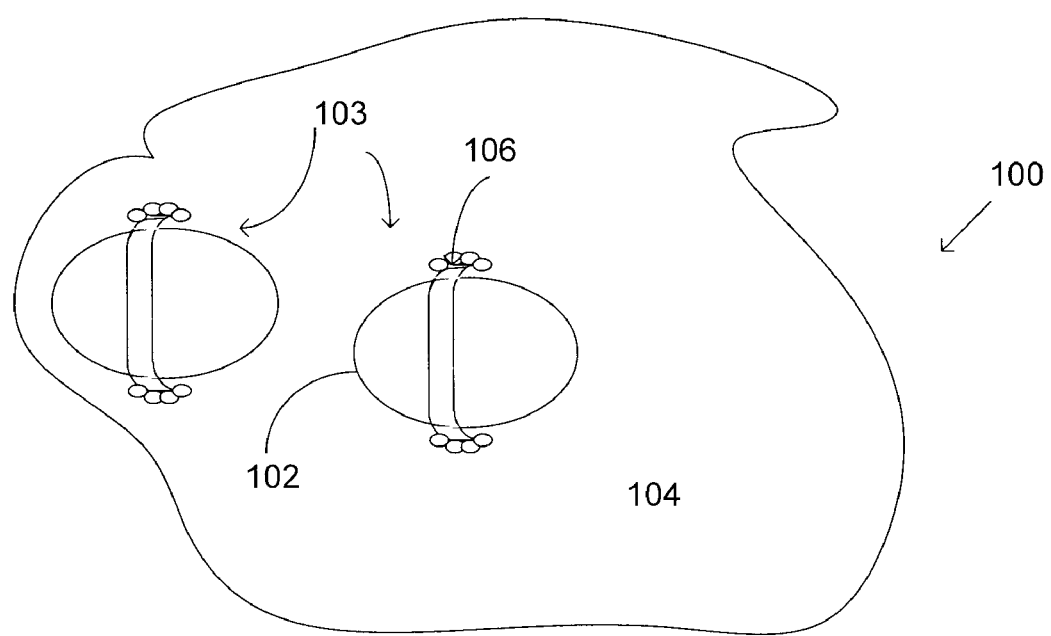
FIGS. 1a-1e represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming nano-coated structures are described. Those methods may include coating an interconnect structure disposed on a die with a layer of functionalized nanoparticles, wherein the functionalized nanoparticles are dispersed in a solvent, heating the layer of functionalized nanoparticles to drive off a portion of the solvent, and then applying an epoxy underfill on the coated interconnect structure. Methods of the present invention may improve adhesion between first level interconnects and epoxy under-fills in microelectronic packages.

FIGS. 1a-1e illustrate embodiments of methods for improving the adhesion between interconnect structures and under-fill materials. FIG. 1a illustrates a portion of a nanoparticle suspension 100. The nanoparticle suspension 100 may comprise at least one functionalized nanoparticles 103 that may be dispersed in a solvent 104. In some embodiments the functionalized nanoparticle 103 may include but is not limited to silica and/or alumina nanoparticles 102, wherein the surface chemistry of the at least one nanoparticle 102 may be functionalized, and may comprise a functional group 106. The functional group 106 may comprise such functional groups as thiols, silanes, ammonium-silane salts, silane coupling agents and/or other such polymers which have good adhesion with copper and under-fill materials, for example, in some embodiments.

Figure 1B:
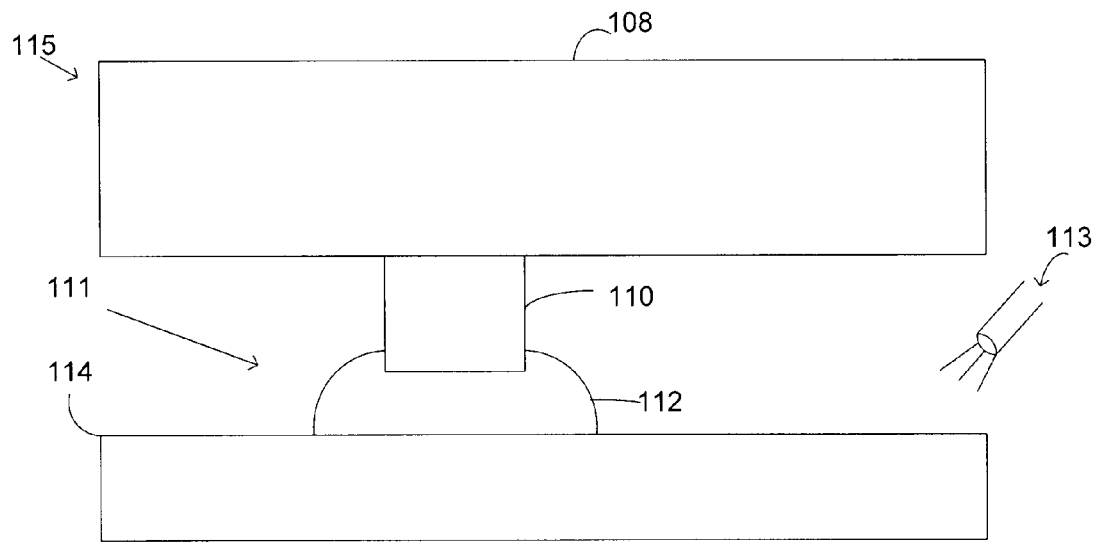

In one embodiment, the solvent 104 may comprise a dilute concentration, which is easy to flow. The solvent 104 may include acetone, toluene, water, ethylene glycol, and isopropyl alcohol in some embodiments and other such volatile, low viscosity solvents. In one embodiment, the nanoparticle solution 100 may be dispensed 113 under a die 108 to coat an interconnect structure 110 (FIG. 1b). In one embodiment, the die 108 may comprises a portion of a microelectronic package 115, wherein a solder bump 112 may be disposed on a substrate portion 114 of the microelectronic package 115.

In one embodiment, the interconnect structure 110 may comprise at least one of a lead free solder interconnect structure, such as SnAg or SnAgCu, for example, and a copper interconnect structure. In one embodiment, the nanoparticle solution 100 may be dispersed around the die 108 after the interconnect structure 110 is attached to the solder bump 112, such as after a chip attach process, but prior to an under-fill dispense step.

Figure 1C:
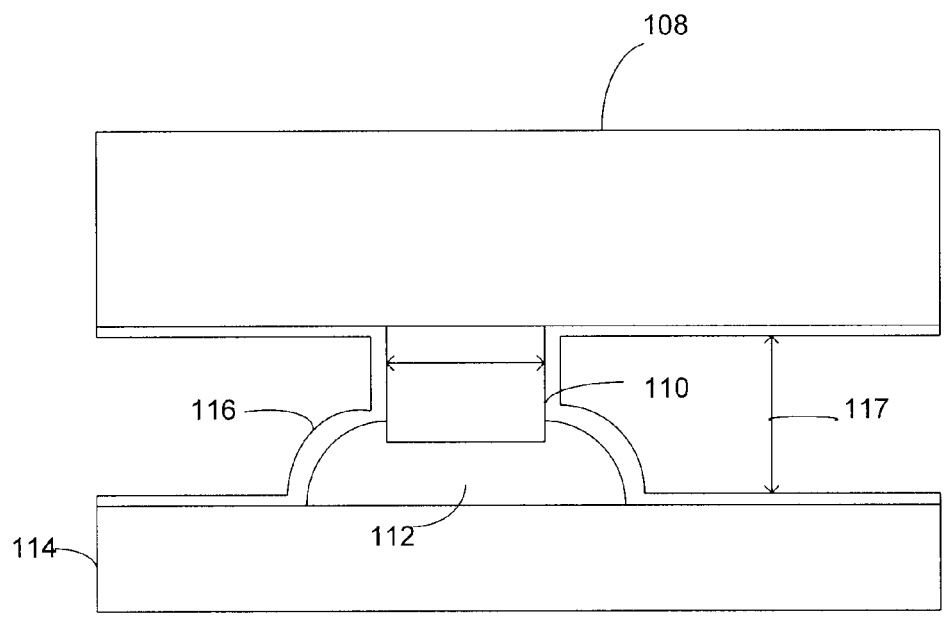

In one embodiment, the nanoparticle solution 100 may coat the interconnect structure 110, a die region 111 surrounding the interconnect structure 110, a portion of the substrate 114, and the solder bump 112 that may be disposed on the interconnect structure 110 (FIG. 1c). In one embodiment, the nanoparticle solution 100 may form a layer 116 of functionalized nanoparticles on the interconnect structure 110. In one embodiment, the layer 110 may be a thin layer, and may comprise a thickness of about 10 to about 500 of nanometers.

In one embodiment, a die gap region 117 disposed between the die 108 and the substrate 114 may not be substantially filled with the nanoparticle suspension 100. In one embodiment, the dispense process 113, which may be carried out post chip-attach, may use only so much quantity of the functionalized nanoparticle suspension 100 that is needed to create a thin layer on the inner walls (i.e. on the inner walls of the die 108, the solder ball 112, the interconnect structure 110, and the substrate 114) of a die cavity that may exist between the die 108 and the substrate 114.

Figure 1D:
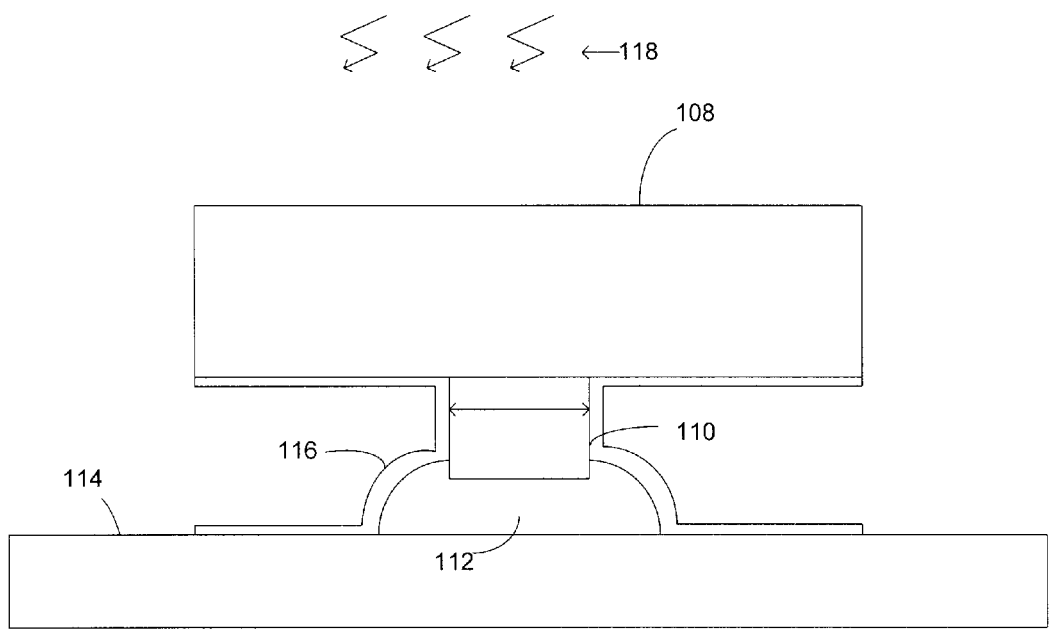

In one embodiment, the layer 116 of functionalized particles may be dispensed in either one or multiple dispense cycles, according to the particular application. For example, a relatively larger die may require multiple dispense cycles, whereas a relatively smaller die may require fewer or a single dispense cycle. After the layer 116 is formed on the interconnect structure 110, a portion of the solvent 104 from the layer 116 of functionalized nanoparticles may be evaporated 118 by heating the layer 116 (FIG. 1d). In one embodiment, after the portion of the solvent 104 is driven off by a bake process, for example, the layer 116 of functional ized nanoparticles may adhere and/or wet the surface of the interconnect structure 110.

The basis for surface wettability changes (increase or decrease) in a nanocoating, such as the functionalized nanoparticles 103, is as follows: a nanocoating, due to its nanoscale surface features, offers very high effective surface area. This may cause step changes in its wetting properties. If a liquid originally wets a material on a macro-scale, it tends to super-wet the material on a nanoscale. This is called hemi-wicking. The same may be true for non-wetting liquids. That is, if the liquid originally does not wet a given material on macro-scale, then it would be super-hydrobic on a nanocoating of that material. For excellent adhesion between any two surfaces, wetting is essential, according to the following equation: $G=fn(P, \cos\theta)$, where G is the Adhesion strength, $\theta$ is the contact angle, and P is the applied load.

Figure 1E:
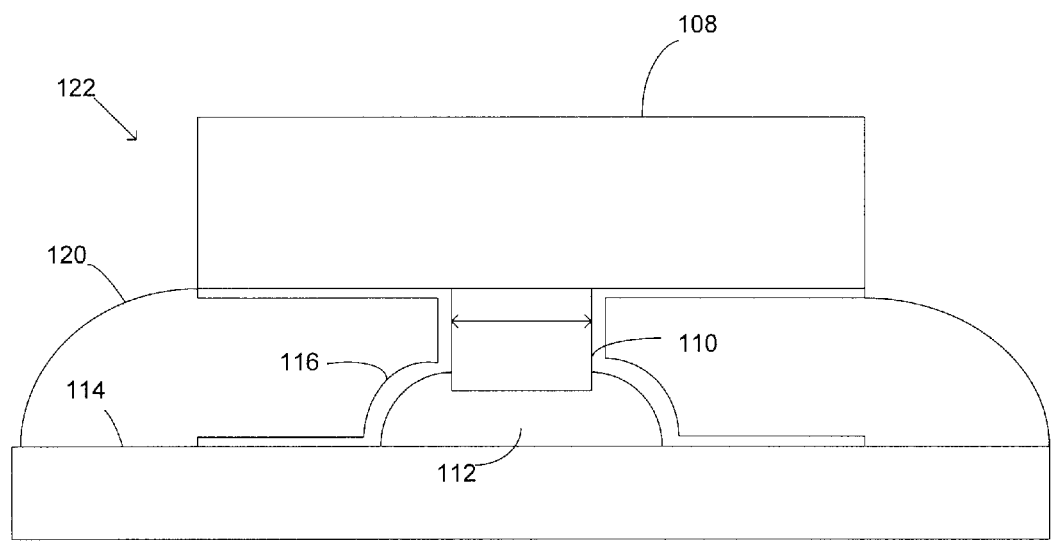

An under-fill material 120 may be dispensed between the die 108 and the substrate 112, according to methods known in the art (FIG. 1e). In one embodiment, the underfill material 120 may then be cured, as is known in the art. By tailoring the surface functional group chemistry of the nanoparticles, the layer 116 of functionalized nanoparticles can be stabilized on the interconnect structure 110, and can wet the under-fill material 120 that may be dispensed between the die 108 and the substrate 112. Thus, the layer 116 of functionalized nanoparticles offers a very high effective surface area coating on the interconnect structure 110 that enhances wettability between the interconnect structure 110 and the underfill material 120. In one embodiment, the nanotube and/or nanowire coating 216 disposed on the interconnect structure 110, the die region 111 surrounding the interconnect structure 110, the portion of the substrate 114, and the solder bump 112 may comprise a nanocoated package interconnect structure 122.

Figure 2A:
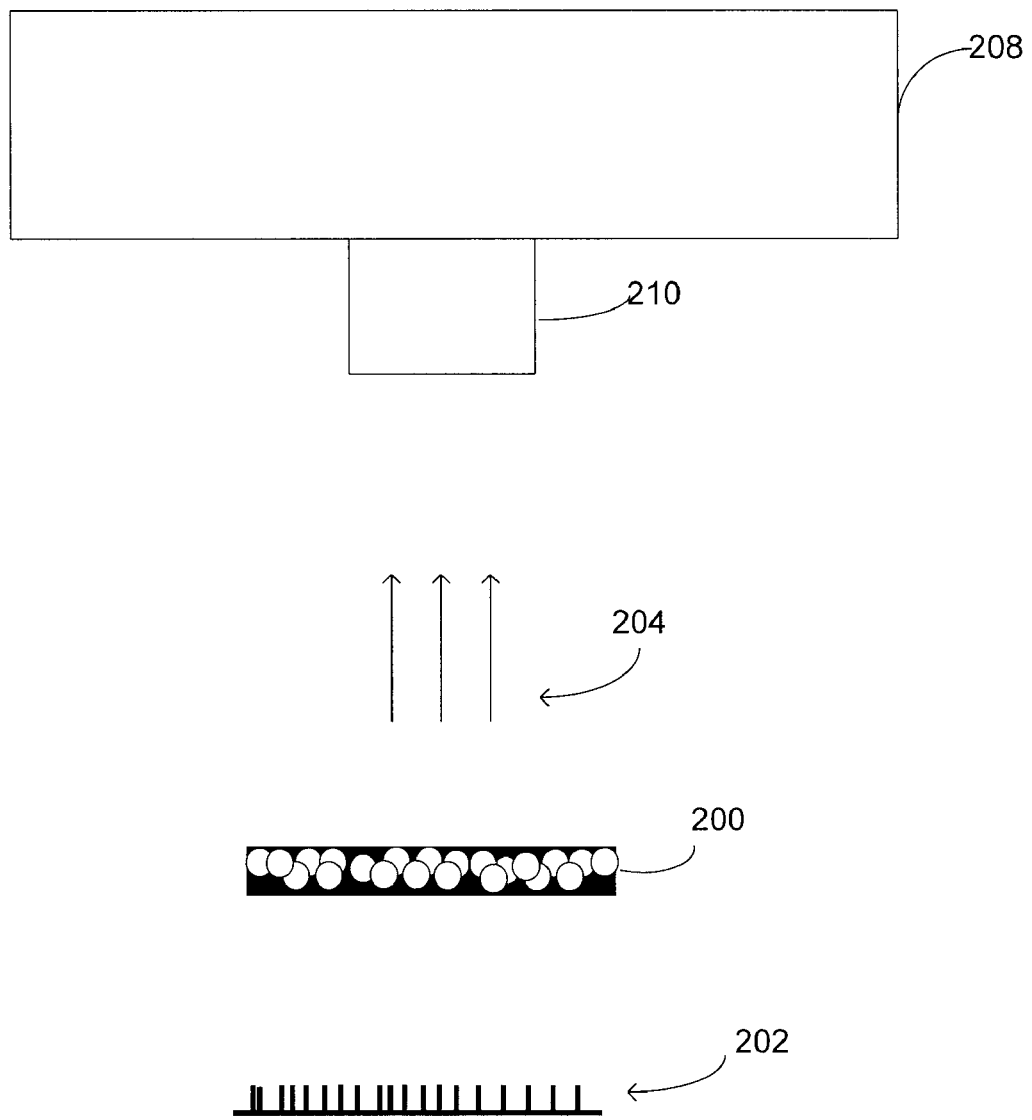
FIGS. 2a-2d represent structures according to an embodiment of the present invention.
Figure 2B:
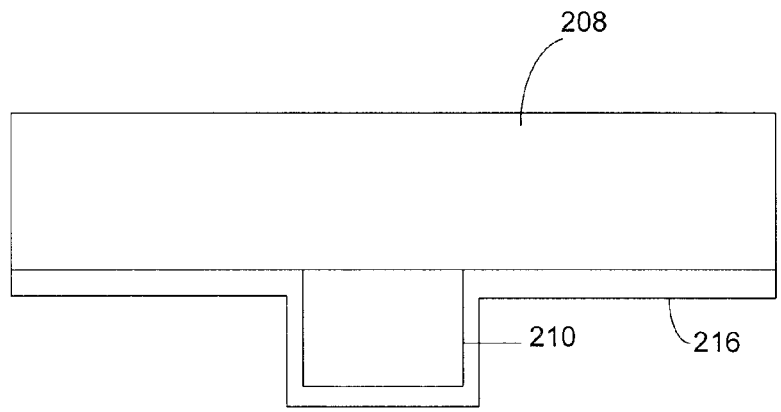

FIG. 2a illustrates a portion of an array of aligned carbon nanotubes 200. The array of carbon nanotubes 200 may comprise any kind of carbon nanotubes (i.e. they may comprise single and/or multi-walled nanotubes). Carbon nanotubes are known to wet organic liquids, as well as polymer resins, such as epoxy. Thus, adhesion of epoxy underfill materials with a surface coated with carbon nanotubes is expected to be good, provided the nanotubes form open networks such as aligned arrays, where the nanotube surface area is available for epoxy wetting and infiltration. As against this, some of the nanotube networks such as a carbon nanotube paper (buckypaper) may possess dense networks of randomly oriented nanotubes, wherein epoxy infiltration may be difficult, and may result in entrapped voids.

In one embodiment, the aligned nanotube array 200 can be grown separately (ex situ), and then later may be placed 204 onto an interconnect structure 210, such as a copper bump for example, that may be disposed on a die 208. In one embodiment, the array of aligned carbon nanotubes 200 may be grown ex situ by chemical vapor deposition (CVD) on a given substrate such as a silicon and/or quartz substrate. In one embodiment, the aligned array of carbon nanotubes 200 may be grown on nickel-plated copper islands, and/or any suitable metal catalyst followed by transference onto an interconnect structure by methods known in the art.

In another embodiment, the aligned array of nanotubes 200 can be grown directly in situ onto an interconnect structure. In one embodiment, the aligned array of nanotubes 200 can be grown in situ directly on the interconnect structure 210 surface, using a CVD technique, for example. A nickel coating may be applied to the interconnect structure 210, which may then act as a catalyst for the growth of the aligned carbon nanotubes 200. The aligned array of carbon nanotubes 200 may exhibit excellent adhesion to an interconnect structure.

Alternatively, very short metallic or ceramic nanowires 202 can be grown at lower temperatures by glancing angle methods, and may be used to coat the interconnect structure 210. Such wires could serve as adhesion promoting coatings, via increase in surface area. In one embodiment, when the interconnect structure 210 comprises copper, the nanowires 202 may be grown directly on the interconnect structure 210. In such a case the wires may increase adhesion as well as improve the current carrying capacity of the interconnect structure 210.

In one embodiment, the nanotubes 200 may coat the interconnect structure 210 and the die 208 (FIG. 2 b). In one embodiment, the nanotubes 200, may form a layer 216 of nanotubes 200 on the interconnect structure 210 and on a portion of the die 208. In one embodiment, the layer 216 may be a thin layer, and may comprise a thickness of about 10 angstroms to about 500 nanometers.

Figure 2C:
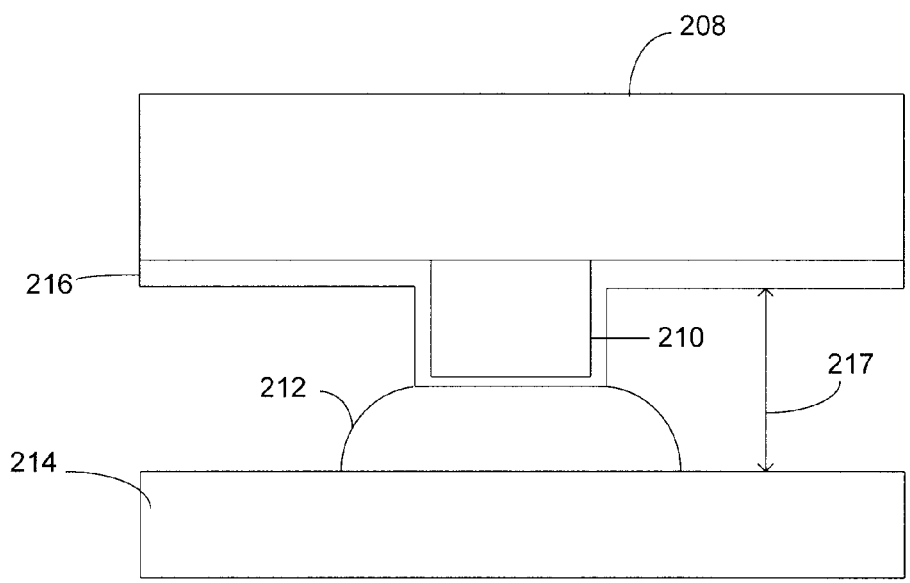

In one embodiment, after the layer 216 is formed, a solder bump 212 disposed on a substrate 214 may be attached to the interconnect structure 210, by utilizing any suitable method, such as by utilizing a chip attach process, for example (FIG. 2c). In one embodiment, the nanotube-coated interconnect structure 210 may be joined to the solder ball 212, such as a lead free solder bump for example, by utilizing solder reflow, wherein the layer 216 may be joined to the solder bump 212. In one embodiment, a deflux process may follow chip attach and/or solder reflow.

In one embodiment, wherein the layer 216 is comprised of nanowires 202, the coating 216 may be applied by a solvent dispersion method. In some embodiments, the nanowires grown directly on interconnects prior to chip attach, may lead to potential electromigration and solder joint reliability (such as bump fatigue, cracking) issues, thus nanowires may be formed on the interconnect structure 210 after chip attach. In general, carbon nanotube growth or transfer onto the interconnect structure 210 may be performed before the chip attach process and a nanowire or nanoparticle growth and transfer maybe performed after chip attach.

Figure 2D:
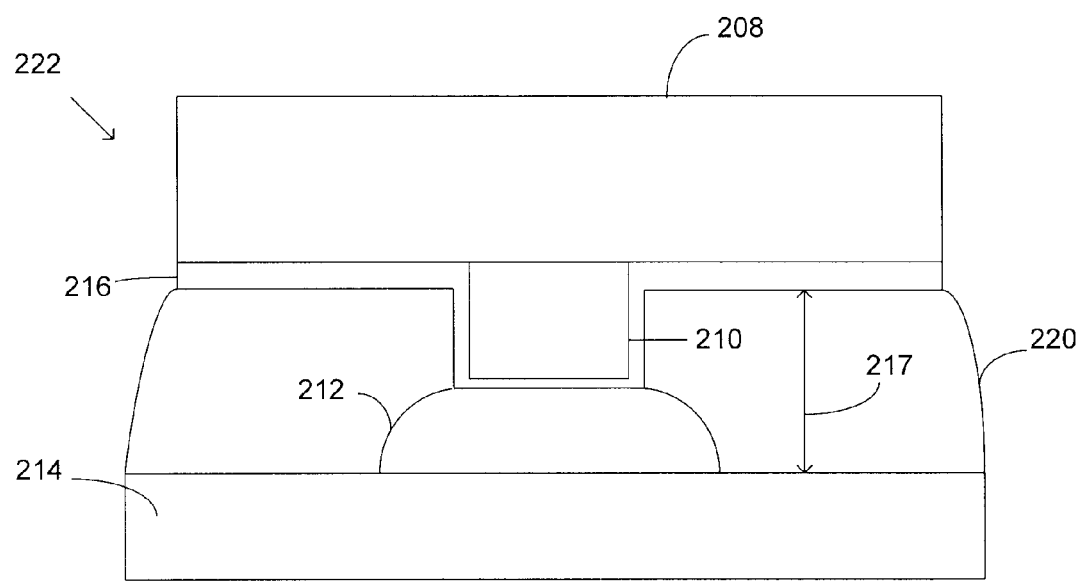

In one embodiment, a die gap region 217 disposed between the die 208 and the substrate 214 may not be substantially filled with the nanotube and or nanowire arrays 200, 202. In one embodiment, an underfill material 220 may be applied to the interconnect structure coated with the nanotube and/or nanowire layer (FIG. 2d). The nanotube and/or nanowire coating 216 disposed on the interconnect structure 210 and a portion of the die 208 may act as an adhesion enhancer for the underfill material 220, which may comprise an epoxy underfill in some embodiments. In one embodiment, the nanotube and/or nanowire coating 216 disposed on the interconnect structure 210 and a portion of the die 208 may comprise a nanocoated package interconnect structure 222. One advantage of carbon nanotubes over the nanoparticle coating previously described herein, is improvement in current carrying capability, since the nanotube coating will not adversely affect the current carrying capacity.

Figure 3A:
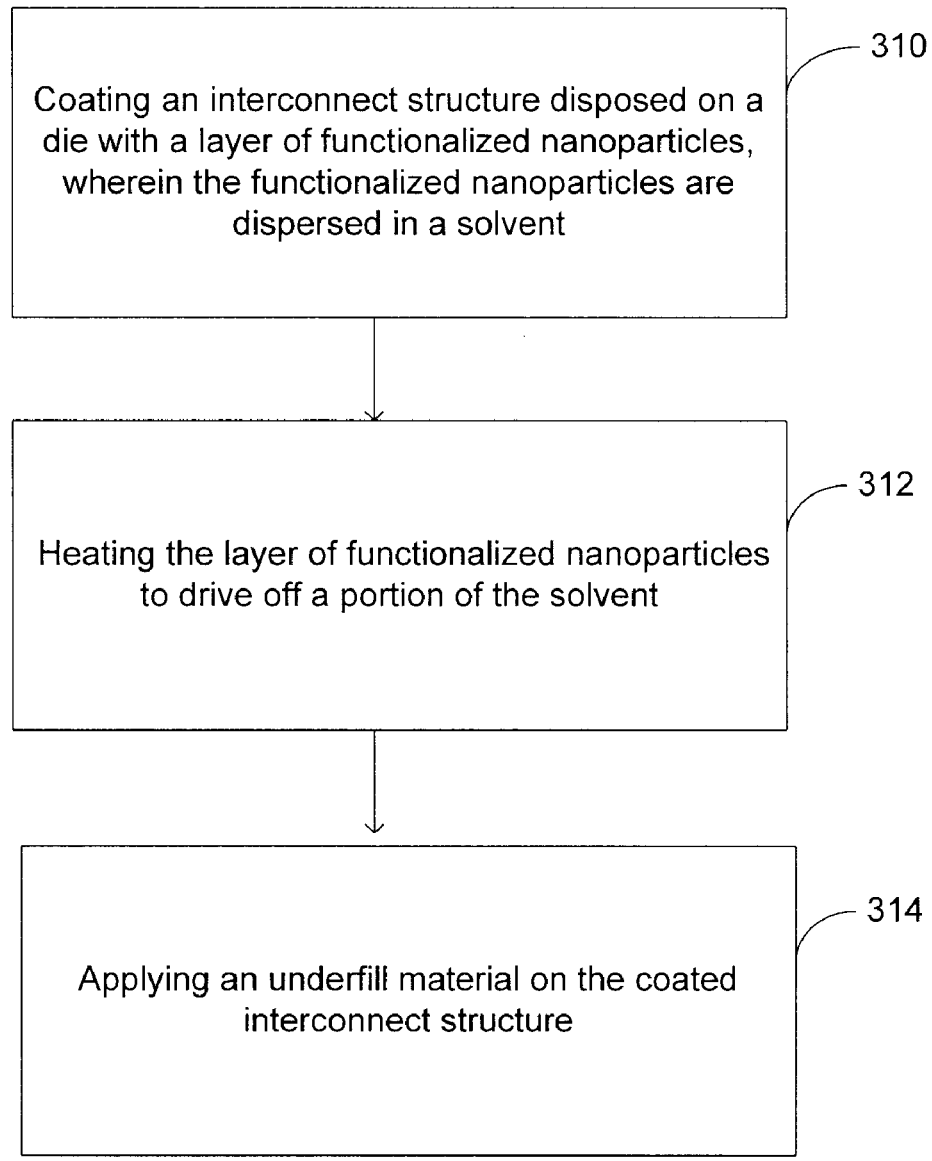
FIG. 3a-3b represent flow charts according to embodiments of the present invention.

FIG. 3a depicts a flow chart according to an embodiment of the present application. At step 310, an interconnect structure disposed on a die may be coated with a layer of functionalized nanoparticles, wherein the functionalized nanoparticles are dispersed in a solvent. At step 312, the layer of functionalized nanoparticles may be heated to drive off a portion of the solvent, and at step 314, an underfill material may be applied on the coated interconnect structure.

Figure 3B:
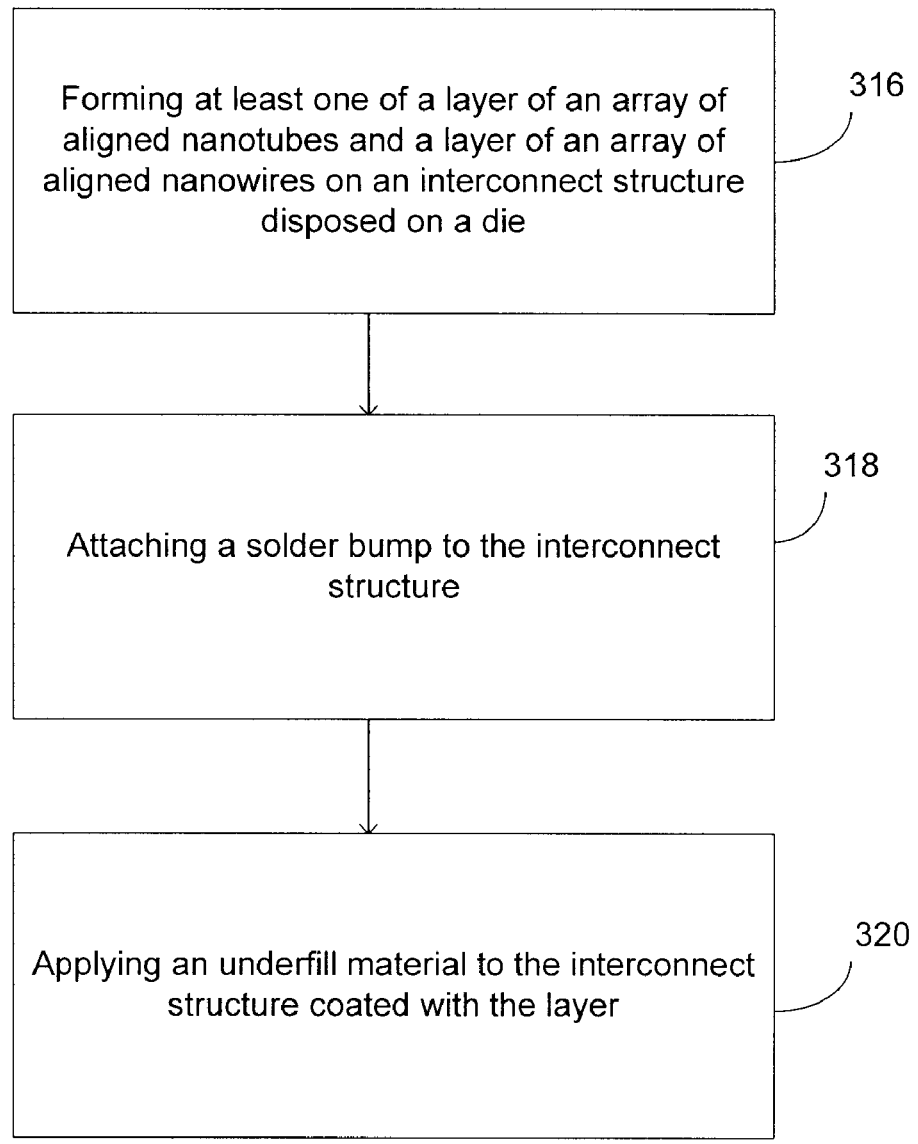

FIG. 3b depicts a flow chart of another embodiment of the present application. At step 316, a layer of an array of aligned nanotubes may be formed on an interconnect structure disposed on a die. At step 318, a solder bump to the may be attached to the interconnect structure, and at step 320, an underfill material may be applied to the interconnect structure.

Figure 4:
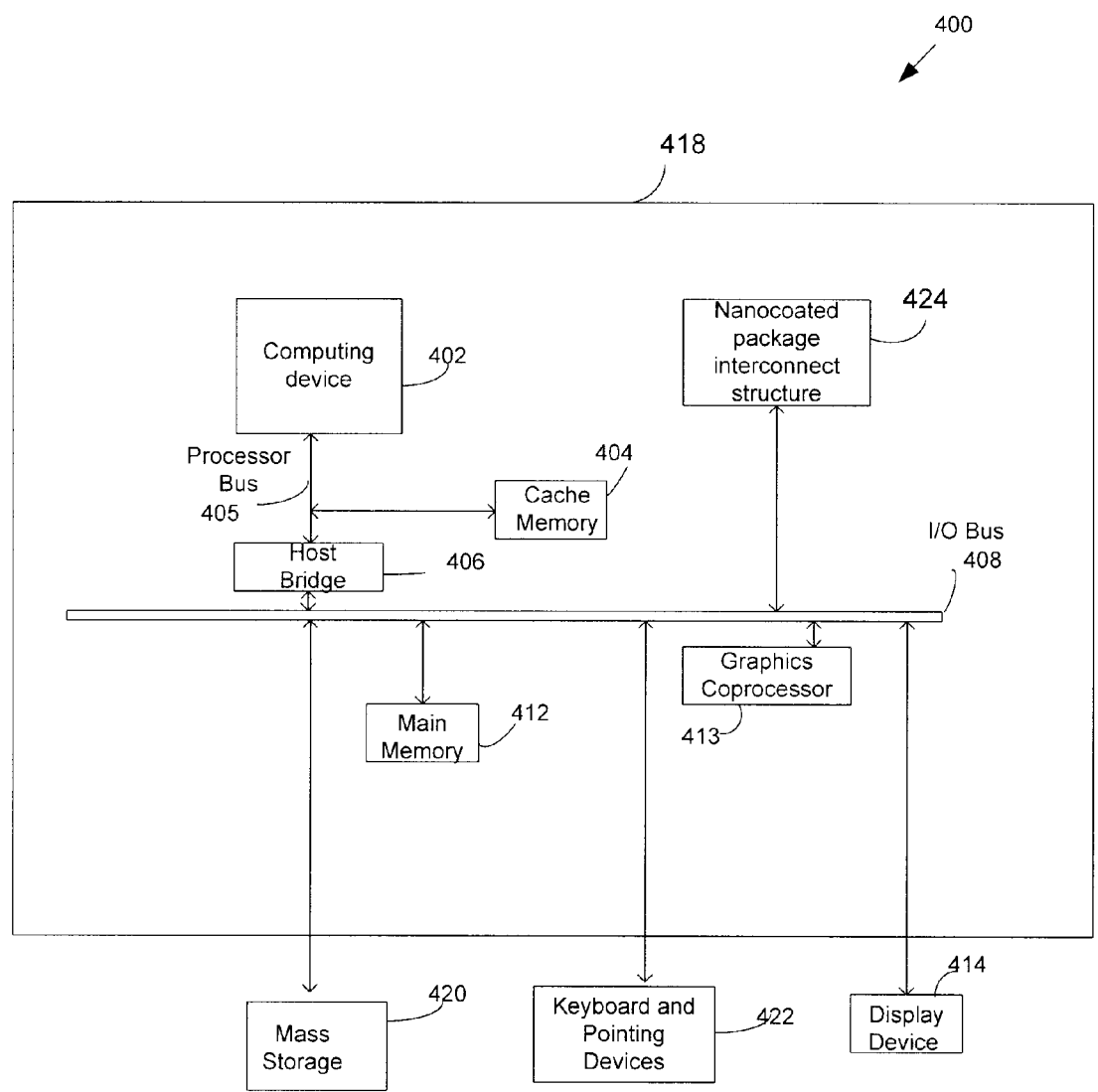
FIG. 4 represents a system according to an embodiment of the present invention.

FIG. 4 is a diagram illustrating an exemplary system 400 capable of being operated with microelectronic structures of the present invention, such as the nanocoated package interconnect structure 122 of FIG. 1e, for example. It will be understood that the present embodiment is but one of many possible systems in which the nanocoated package interconnect structure of the present invention may be used.

In the system 400, the nanocoated package interconnect structure 424 may be communicatively coupled to a printed circuit board (PCB) 418 by way of an I/O bus 408. The communicative coupling of the nanocoated package interconnect structure 424 may be established by physical means, such as through the use of a package and/or a socket connection to mount the nanocoated package interconnect structure 424 to the PCB 418 (for example by the use of a chip package, interposer and/or a land grid array socket). The nanocoated package interconnect structure 424 may also be communicatively coupled to the PCB 418 through various wireless means (for example, without the use of a physical connection to the PCB), as are well known in the art.

The system 400 may include a computing device 402, such as a processor, and a cache memory 404 communicatively coupled to each other through a processor bus 405. The processor bus 405 and the I/O bus 408 may be bridged by a host bridge 406. Communicatively coupled to the I/O bus 408 and also to the nanocoated package interconnect structure 424 may be a main memory 412. Examples of the main memory 412 may include, but are not limited to, static random access memory (SRAM) and/or dynamic random access memory (DRAM), and/or some other state preserving mediums. The system 400 may also include a graphics coprocessor 413, however incorporation of the graphics coprocessor 413 into the system 400 is not necessary to the operation of the system 400. Coupled to the I/O bus 408 may also, for example, be a display device 414, a mass storage device 420, and keyboard and pointing devices 422.

These elements perform their conventional functions well known in the art. In particular, mass storage 420 may be used to provide long-term storage for the executable instructions for a method for forming nanocoated package interconnect structures in accordance with embodiments of the present invention, whereas main memory 412 may be used to store on a shorter term basis the executable instructions of a method for forming nanocoated package interconnect structures in accordance with embodiments of the present invention during execution by computing device 402. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 412 may supply the computing device 202 (which may be a processor, for example) with the executable instructions for execution.

Benefits of the present invention include but are not limited to improving the adhesion between copper bumps and underfill by application of high surface area nano-coatings around the bump surfaces, after interconnects are formed by solder reflow. These nano-coatings serve to improve the wettability of under-fills onto copper interconnect bumps and thereby improve the copper-underfill adhesion. Thus, the resulting package will be robust. In some embodiments, adhesion between first level interconnects and epoxy under-fill in microelectronic packages may be improved.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
    coating an interconnect structure disposed on a die with at least one of a layer of functionalized nanoparticles and nanowires, wherein the functionalized nanoparticles are dispersed in a solvent;
    heating the layer comprising at least one of a layer of functionalized nanoparticles and nanowires, to drive off a portion of the solvent; and
    applying an underfill on the coated interconnect structure.

2. The method of claim 1 further comprising wherein the layer is dispersed around the die after the interconnect structure is attached to a solder bump.

3. The method of claim 2 further comprising wherein the interconnect structure is disposed on the die, wherein the die comprises a portion of a microelectronic package, and wherein the solder bump is disposed on a substrate portion of the microelectronic package.

4. The method of claim 1 further comprising wherein the functionalized nanoparticles are dispersed in a low viscosity, volatile solvent.

5. The method of claim 4 further comprising wherein the solvent comprises at least one of acetone, toluene, water, ethylene glycol, and isopropyl alcohol.

6. The method of claim 1 wherein coating the interconnect structure comprises dispensing a nanoparticle suspension around the die.

7. The method of claim 6 wherein dispensing the nanoparticle suspension around the die comprises dispensing the nanoparticle suspension by utilizing multiple dispensing steps around the die.

8. The method of claim 6 further comprising wherein a die gap region disposed between the die and a substrate is not substantially filled with the nanoparticle suspension.

9. The method of claim 1 wherein the nanoparticle functionality may comprise at least one of ammonium-silane salts, silane coupling agents, thiol groups and polymers.

10. The method of claim 1 further comprising wherein the interconnect structure comprises at least one of a lead free solder interconnect structure and a copper interconnect structure.

11. A method comprising:
    forming a layer comprising an array of aligned nanotubes on an interconnect structure disposed on a die;
    attaching a solder bump to the interconnect structure; and
    applying an underfill material to the interconnect structure coated with the layer.

12. The method of claim 11 further comprising wherein the layer is formed by at least one of an ex situ and in situ method.

13. The method of claim 11 further comprising wherein the solder bump is reflowed during the attachment of the solder bump to the interconnect structure, and wherein the layer is joined to the solder bump.

14. The method of claim 11 further comprising wherein the die comprises a portion of a microelectronic package, and wherein the solder bump is disposed on a substrate of the microelectronic package.

* * * * *